United States Patent
Iino

(10) Patent No.: US 9,628,204 B2
(45) Date of Patent: Apr. 18, 2017

(54) COMMUNICATION DEVICE, RECEPTION POWER MONITORING DEVICE, AND COMMUNICATION DEVICE SYSTEM

(71) Applicant: NEC CORPORATION, Tokyo (JP)

(72) Inventor: Satoshi Iino, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/774,192

(22) PCT Filed: Feb. 6, 2014

(86) PCT No.: PCT/JP2014/000626
§ 371 (c)(1),
(2) Date: Sep. 10, 2015

(87) PCT Pub. No.: WO2014/141583
PCT Pub. Date: Sep. 18, 2014

(65) Prior Publication Data
US 2016/0028500 A1    Jan. 28, 2016

(30) Foreign Application Priority Data

Mar. 11, 2013  (JP) ................................ 2013-048045

(51) Int. Cl.
*H04M 1/00* (2006.01)
*H04B 17/318* (2015.01)
(Continued)

(52) U.S. Cl.
CPC .......... *H04B 17/318* (2015.01); *H03F 3/189* (2013.01); *H03F 3/245* (2013.01);
(Continued)

(58) Field of Classification Search
CPC ..................................................... H03K 3/356
(Continued)

(56) References Cited

U.S. PATENT DOCUMENTS 6,005,376 A * 12/1999 Mett .......................... G05F 1/46
  323/275
6,404,284 B1   6/2002 Johnson
(Continued)

FOREIGN PATENT DOCUMENTS

JP      4-172928      6/1992
JP      11-68680      3/1999
(Continued)

OTHER PUBLICATIONS

Satoshi, Display Device for Satellite Broadcast Reception State, Sep. 3, 1999, machine translation in PDF file, pp. 1-12.*
(Continued)

*Primary Examiner* — Sonny Trinh
(74) *Attorney, Agent, or Firm* — Finnegan, Henderson, Farabow, Garrett & Dunner, L.L.P.

(57) ABSTRACT

A communication device system includes a communication device (1) and a reception power monitoring device (2). The communication device (1) includes a reception processing unit (10) that outputs a signal intensity voltage (Vin) in accordance with a signal level of a received signal, and a monitoring terminal signal generator circuit (30) that generates a monitoring terminal signal (Vout) by current amplification of a level shift voltage generated by shifting a level of the signal intensity voltage (Vin) by an offset voltage (Voff) corresponding to a voltage value of a power supply voltage of an external device. The reception power monitoring device (2) includes a constant voltage generator circuit that outputs a constant voltage from the monitoring terminal signal (Vout), and a voltage converter circuit that operates based on the constant voltage and outputs a display level indication signal reflecting a voltage level of the monitoring terminal signal (Vout).

10 Claims, 6 Drawing Sheets

(51) Int. Cl.
*H04B 1/3877* (2015.01)
*H03F 3/189* (2006.01)
*H03F 3/24* (2006.01)
*H03F 3/45* (2006.01)
*H03K 3/356* (2006.01)
*H04B 1/04* (2006.01)

(52) U.S. Cl.
CPC ......... *H03F 3/45475* (2013.01); *H03K 3/356* (2013.01); *H04B 1/3877* (2013.01); *H03F 2200/211* (2013.01); *H03F 2200/411* (2013.01); *H03F 2203/45528* (2013.01); *H03F 2203/45594* (2013.01); *H04B 2001/0416* (2013.01)

(58) Field of Classification Search
USPC ................... 455/572, 343.1, 343.6; 324/433; 320/164, 162
See application file for complete search history.

(56) References Cited

U.S. PATENT DOCUMENTS 7,623,896 B2 * 11/2009 Tanaka ................. H03G 1/0088
330/297
8,274,259 B2 * 9/2012 Ashida .................... H02J 7/045
320/128
2006/0158393 A1 * 7/2006 Fukumoto ............ G09G 3/3275
345/76
2011/0012939 A1 1/2011 Fukumoto et al.

FOREIGN PATENT DOCUMENTS

| | | |
|---|---|---|
| JP | 2001-165973 | 6/2001 |
| JP | 2004-15463 | 1/2004 |
| JP | 2006-511111 | 3/2006 |
| JP | 2006-189806 | 7/2006 |
| RU | 2 124 809 C1 | 1/1999 |

OTHER PUBLICATIONS

International Search Report mailed May 13, 2014 in corresponding PCT International Application.
Extended European Search Report mailed on Sep. 28, 2016, by the European Patent Office in counterpart European Patent Application No. 14763825.8.
Office Action issued by the Russian Patent Office in counterpart Russian Patent Application No. 2015140615/07(062492), dated Dec. 1, 2016.

* cited by examiner

US 9,628,204 B2

COMMUNICATION DEVICE, RECEPTION POWER MONITORING DEVICE, AND COMMUNICATION DEVICE SYSTEM

CROSS-REFERENCE TO RELATED PATENT APPLICATIONS

This application is a National Stage Entry of International Application No. PCT/JP2014/000626, filed Feb. 6, 2014, which claims priority from Japanese Patent Application No. 2013-048045, filed Mar. 11, 2013. The entire contents of the above-referenced applications are expressly incorporated herein by reference.

TECHNICAL FIELD

The present invention relates to a communication device, a reception power monitoring device and a communication device system and, for example, relates to a communication device, a reception power monitoring device and a communication device system that supply power and a desired signal to a device connected externally.

BACKGROUND ART

A method of using a radio signal as a backhaul line has attracted attention in recent years. In a communication device that forms a communication line by such a radio signal, it is necessary to optimize reception power by using a reception power monitoring device such as a level meter that monitors reception signal power for adjusting the antenna orientation. The level meter generally drives with an external power supply such as a battery. However, because battery maintenance is required for the reception power monitoring device despite that it is used for installation, maintenance and inspection of a radio device and the like and not used all the time, there is a problem that the management cost is high.

In view of the above, the technique that generates power for a device or a circuit to operate from a radio signal is disclosed in Patent Literature 1. According to Patent Literature 1, a data transmitting line that is connected to a pulled-up data transmission line of an external device is provided with a power supply conversion means that converts electric energy on the data transmitting line into voltage and supplies it to a main control device.

Further, the technique that generates a signal indicating a signal level of a radio signal from the radio signal and displays the signal level on a display device is disclosed in Patent Literature 2. Patent Literature 2 relates to an electromagnetic wave monitoring device, which includes a transmission line that is connected to an appropriate radio device and an electromagnetic wave generation device 1 and receives or transmits a specified electromagnetic wave and a coupling means that is magnetically coupled to the transmission line and converts the electromagnetic wave received or to be transmitted into an electrical signal such as a voltage signal or a current signal, for example. Further, the electromagnetic wave monitoring device described in Patent Literature 2 includes a detection means that is connected to the coupling means and detects the electrical signal output from the coupling means, a storage means connected to the detection means, and an annunciation means connected to the storage means through a switching means.

Further, the technique that stores the energy of a transmission signal in a capacitor that functions as an energy storage unit and generates DC voltage from the energy stored in the capacitor is disclosed in Patent Literature 3.

Further, the technique that generates high voltage from a received signal is disclosed in Patent Literature 4. Patent Literature 4 relates to a portable receiver that includes a reception antenna, a specific electric wave detector circuit, a power supply control circuit, a load circuit and a battery. In Patent Literature 4, the specific electric wave detector circuit is composed of a tuned circuit in which a parallel resonance frequency is adjusted to catch a specific electric wave only and a high voltage generator circuit that outputs detection voltage generated by stepping up the voltage obtained in the tuned circuit three times or more. Then, in Patent Literature 4, the power supply control circuit 3 turns off a switching element and does not supply power to a load circuit in the standby mode where the detection voltage is low, and turns on the switching element and supplies power to the load circuit in the specific electric wave receiving mode where the detection voltage is high.

CITATION LIST

Patent Literature

PTL1: Japanese Unexamined Patent Application Publication No. H04-172928
PTL2: Japanese Unexamined Patent Application Publication No. 2001-165973
PTL3: Japanese Unexamined Patent Application Publication No. 2006-511111
PTL4: Japanese Unexamined Patent Application Publication No. 2004-015463

SUMMARY OF INVENTION

Technical Problem

However, according to the techniques disclosed in Patent Literature 1 to 4, it is not possible to solve the problem that, when another device such as a monitoring device is connected externally, it is required to prepare a power supply for this device.

The present invention has been accomplished to solve the above problems and an exemplary object of the present invention is to allow another device connected externally to operate without the need to prepare a power supply for this device.

Solution to Problem

A communication device according to one exemplary aspect of the present invention includes a detector circuit that outputs a signal intensity voltage in accordance with a signal level of a received signal, and a monitoring terminal signal generator circuit that generates a monitoring terminal signal by current amplification of a level shift voltage generated by shifting a level of the signal intensity voltage by an offset voltage.

A reception power monitoring device according to one exemplary aspect of the present invention includes a constant voltage generator circuit that outputs a constant voltage from a monitoring terminal signal output by a communication device to be monitored in accordance with a signal level of a received signal, a voltage converter circuit that operates based on the constant voltage and outputs a display level indication signal reflecting a voltage level of the monitoring terminal signal, and a display unit that displays the signal level of the received signal in accordance with the display level indication signal.

A communication device system according to one exemplary aspect of the present invention includes a communication device including a detector circuit that outputs a signal intensity voltage in accordance with a signal level of a received signal and a monitoring terminal signal generator circuit that generates a monitoring terminal signal by current amplification of a level shift voltage generated by shifting a level of the signal intensity voltage by an offset voltage, and a reception power monitoring device including a constant voltage generator circuit that outputs a constant voltage from the monitoring terminal signal, a voltage converter circuit that operates based on the constant voltage and outputs a display level indication signal reflecting a voltage level of the monitoring terminal signal, and a display unit that displays the signal level of the received signal in accordance with the display level indication signal.

Advantageous Effects of Invention

With the communication device, the reception power monitoring device and the communication device system according to one exemplary aspect of the present invention, it is possible to allow another device connected externally to operate without the need to prepare a power supply for this device.

DESCRIPTION OF EMBODIMENTS

First Exemplary Embodiment

Figure 1:
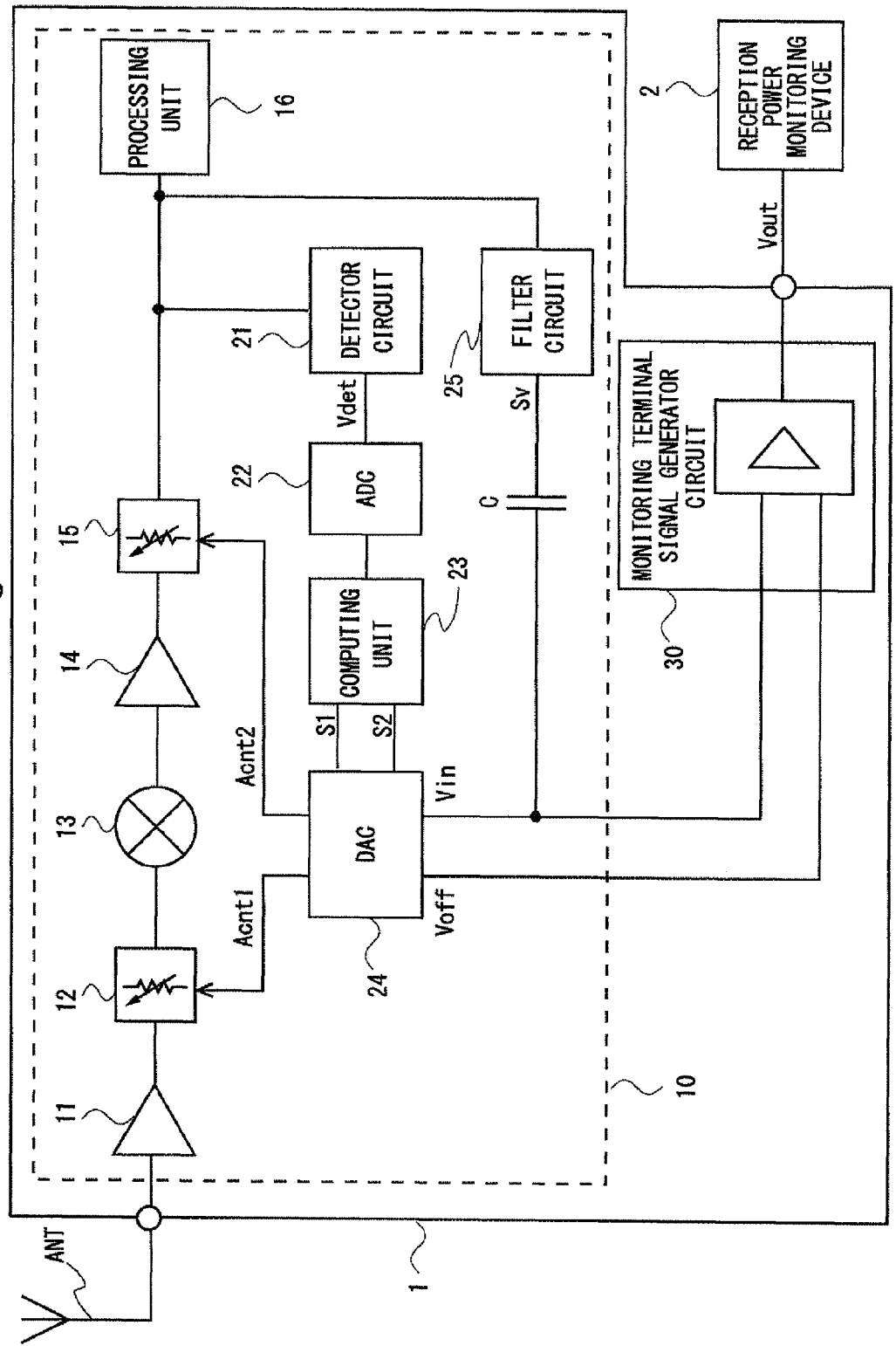
FIG. 1 is a block diagram of a communication device system according to a first exemplary embodiment.

Exemplary embodiments of the present invention are described hereinafter with reference to the drawings. FIG. 1 is a block diagram of a communication device system according to a first exemplary embodiment. As shown in FIG. 1, the communication device system according to the first exemplary embodiment includes a communication device 1 and a reception power monitoring device 2.

The communication device 1 includes an antenna ANT, a reception processing unit 10, and a monitoring terminal signal generator circuit 30. The communication device 1 transmits and receives a radio signal by the antenna ANT. The reception processing unit 10 generates a transmission signal to be transmitted through the antenna ANT and performs various kinds of processing based on a received signal received through the antenna ANT.

For example, the reception processing unit 10 includes amplifiers 11 and 14, attenuators 12 and 15, a mixer 13, a signal processing unit 16, a detector circuit 21, an analog-to-digital converter 22, a computing unit 23, a digital-to-analog converter 24, a filter circuit 25, and a capacitor C. Note that, although the reception processing unit 10 has functional blocks that generate a transmission signal to be output through the antenna ANT, the description thereof is omitted because they are less relevant to the other functions in terms of the description of the communication device 1 according to the first exemplary embodiment.

In the reception processing unit 10, the amplifier 11 amplifies a received signal received by the antenna ANT and outputs it to the attenuator 12. The attenuator 12 attenuates the received signal output from the amplifier 11 by an attenuation rate specified by an attenuation rate control signal Acnt1 and outputs it to the mixer 13 in the subsequent stage. The mixer 13 converts the frequency of the received signal into an intermediate frequency based on a local signal generated by a local signal generator circuit (not shown). The amplifier 14 amplifies the received signal output from the mixer 13 and outputs it to the attenuator 15. The attenuator 15 attenuates the received signal output from the amplifier 14 by an attenuation rate specified by an attenuation rate control signal Acnt2 and outputs it to the signal processing unit 16 in the subsequent stage. The signal processing unit 16 performs various kinds of processing based on the given signal.

The detector circuit 21 detects the received signal based on the signal level of the received signal input to the signal processing unit 16. The detector circuit 21 outputs a detection signal Vdet having a voltage level corresponding to the signal level of the received signal. The detector circuit 21 is composed of a rectifier and a capacitor, for example.

The analog-to-digital converter 22 outputs a detection level signal having a digital value corresponding to the voltage level of the detection signal Vdet. The computing unit 23 outputs a first signal S1 specifying the attenuation rates of the attenuators 12 and 15 that make the level of the received signal input to the signal processing unit 16 become an appropriate signal level and a second signal S2 specifying the value of a signal intensity voltage reflecting the value of the detection level signal. Further, the computing unit 23 adds a value specifying the voltage value of an offset voltage Voff to be applied to the monitoring terminal signal generator circuit 30 to the second signal S2. The digital-to-analog converter 24 outputs the attenuation rate control signals Acnt1 and Acnt2 based on the first signal S1. Further, the digital-to-analog converter 24 outputs a signal strength voltage Vin and an offset voltage Voff based on the second signal S2. In the communication device 1 according to the first exemplary embodiment, it is assumed that the signal intensity voltage Vin and the voltage of the detection signal Vdet have the same voltage level.

Note that the voltage value of the offset voltage Voff specified by the computing unit 23 may be any of a preset value, a value specified externally, and a value calculated by calculation. Further, the offset voltage Voff specifies the power supply voltage of an external device (for example, the reception power monitoring device 2) that is connected to the monitoring terminal.

The filter circuit 25 performs filtering of the received signal input to the signal processing unit 16 and extracts a voice signal Sv. Then, the filter circuit 25 superimposes the voice signal Sv on the signal intensity voltage Vin through the capacitor C.

The monitoring terminal signal generator circuit 30 generates a monitoring terminal signal Vout by current amplification of a level shift voltage generated by shifting the level of the signal intensity voltage Vin by the offset voltage Voff. The monitoring terminal signal Vout is output from the monitoring terminal of the communication device 1. Note that, in the communication device 1 according to the first exemplary embodiment, because the voice signal Sv is superimposed on the signal intensity voltage Vin, the voice signal Sv is also superimposed on the monitoring terminal signal Vout.

The reception power monitoring device 2 is connected with the monitoring terminal of the communication device 1 by a connection means such as a cable. The reception power monitoring device 2 is a level meter that indicates the power level of a received signal received by the antenna ANT in accordance with the signal level of the monitoring terminal signal Vout output from the monitoring terminal. Further, the reception power monitoring device 2 acquires operating power supply from the monitoring terminal signal Vout and operates based on the operating power supply.

Figure 2:
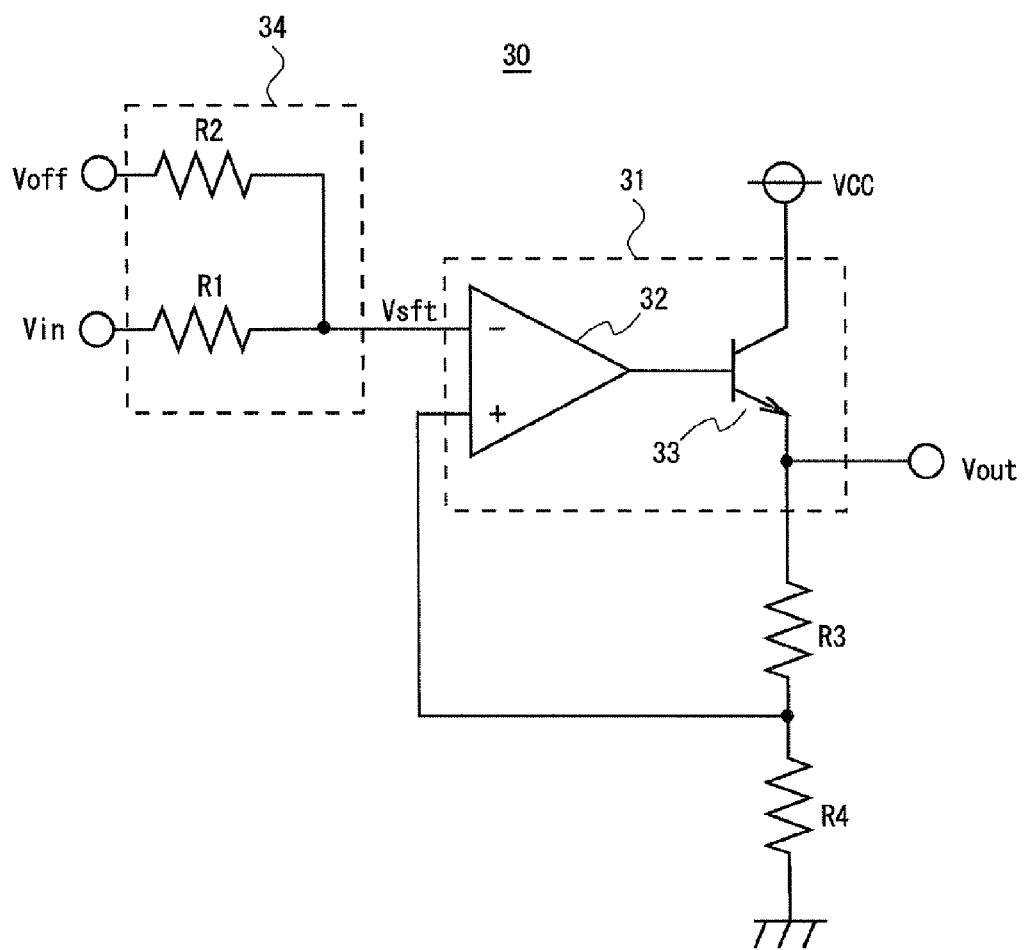
FIG. 2 is a block diagram of a monitoring terminal signal generator circuit according to the first exemplary embodiment.

The monitoring terminal signal generator circuit 30 of the communication device 1 is described in more detail below. FIG. 2 shows a block diagram of the monitoring terminal signal generator circuit 30 according to the first exemplary embodiment. As shown in FIG. 2, the monitoring terminal signal generator circuit 30 includes an amplification unit 31, a voltage addition unit 34, and resistors R3 and R4.

The amplification unit 31 includes an operational amplifier 32 and an output transistor 33. The operational amplifier 32 is supplied with a level shift voltage Vsft output from the voltage addition unit 34 at its inverting input terminal and supplied with a feedback signal of the amplification unit 31 at its non-inverting input terminal. Then, the amplification unit 31 drives the output transistor 33 based on a voltage difference between the level shift voltage Vsft and the voltage level of the feedback signal. Note that the inverting input terminal of the operational amplifier 32 is a non-inverting input terminal of the amplification unit 31, and a non-inverting input terminal of the operational amplifier 32 is an inverting input terminal of the amplification unit 31.

The output transistor 33 has a collector connected to a power supply line that supplies power supply voltage VCC, a base connected to an output terminal of the operational amplifier 32, and an emitter connected to an output terminal of the monitoring terminal signal generator circuit 30 and one end of the resistor R3.

The resistors R3 and R4 are connected in series between the emitter of the output transistor 33 and a ground line through which ground voltage is supplied. A feedback signal is generated at a node between the resistor R3 and the resistor R4.

The voltage addition unit 34 includes resistors R1 and R2. The signal intensity voltage Vin is input to one end of the resistor R1, and the offset voltage Voff is input to one end of the resistor R2. The other end of the resistor R3 and the other end of the resistor R4 are connected to each other, and the level shift voltage Vsft is generated at the node between them.

The operation of the monitoring terminal signal generator circuit 30 is described hereinafter. With the above-described configuration, the monitoring terminal signal generator circuit 30 outputs the monitoring terminal signal Vout by current amplification of the level shift voltage Vsft generated by adding the signal intensity voltage Vin and the offset voltage Voff. The monitoring terminal signal Vout can be represented by the following equation (1):

$$Vout = \frac{R3 + R4}{R3} \cdot \frac{1}{R1 + R2} \cdot (R2 \cdot Voff + R \cdot Vin) \quad (1)$$

According to the monitoring terminal signal Vout represented by the above equation (1), the signal level of the monitoring terminal signal Vout is set by the offset voltage Voff, and the slope based on the level of the signal intensity voltage Vin differs depending on the ratio of the resistors R3 and R4.

Figure 3:
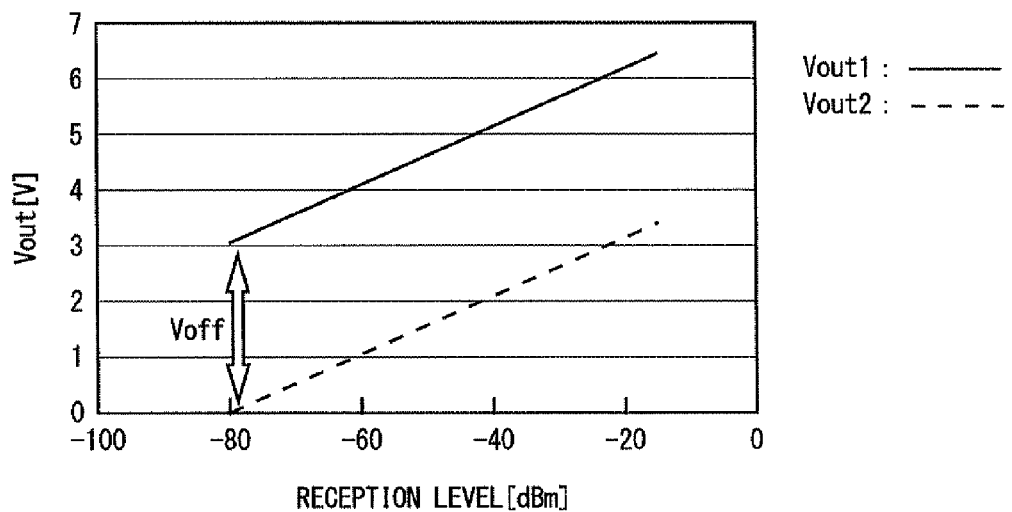
FIG. 3 is a graph showing a relationship between a voltage level of a monitoring terminal signal and offset voltage according to the first exemplary embodiment.

FIG. 3 shows a graph representing the relationship between the voltage level of the monitoring terminal signal Vout and the offset voltage Voff. Note that FIG. 3 and FIG. 4, which is described later, show only the DC component of the monitoring terminal signal Vout and do not show the AC component thereof. In FIG. 3, the received signal level represented by the signal intensity voltage is indicated by the horizontal axis, and the voltage value of the monitoring terminal signal Vout is indicated by the vertical axis. As shown in FIG. 3, in the monitoring terminal signal generator circuit 30, the offset voltage of the monitoring terminal signal Vout can be varied by varying the offset voltage Voff.

Figure 4:
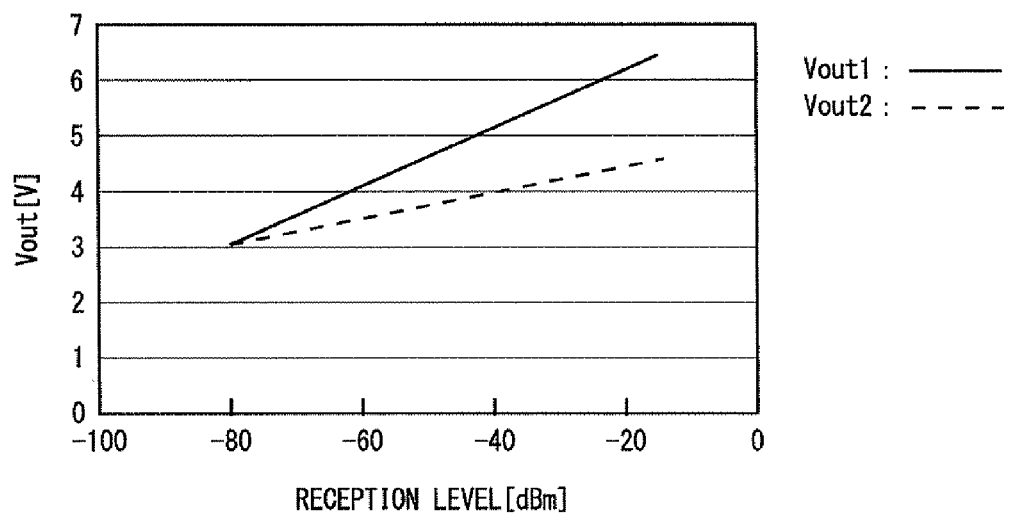
FIG. 4 is a graph showing a slope of a voltage level of a monitoring terminal signal according to the first exemplary embodiment.

FIG. 4 shows a graph representing the slope of the voltage level of the monitoring terminal signal Vout. In FIG. 4, the received signal level represented by the signal intensity voltage is indicated by the horizontal axis, and the voltage value of the monitoring terminal signal Vout is indicated by the vertical axis. As shown in FIG. 4, the slope of the monitoring terminal signal Vout1 indicating the state where the ratio of the resistors R3 and R4 is high is steeper than the slope of the monitoring terminal signal Vout2 indicating the state where the ratio of the resistors R3 and R4 is high. In other words, in the monitoring terminal signal generator circuit 30, the sensitivity of the monitoring terminal signal Vout with respect to the signal intensity voltage Vin can be adjusted by adjusting the ratio of the resistors R3 and R4.

Figure 5:
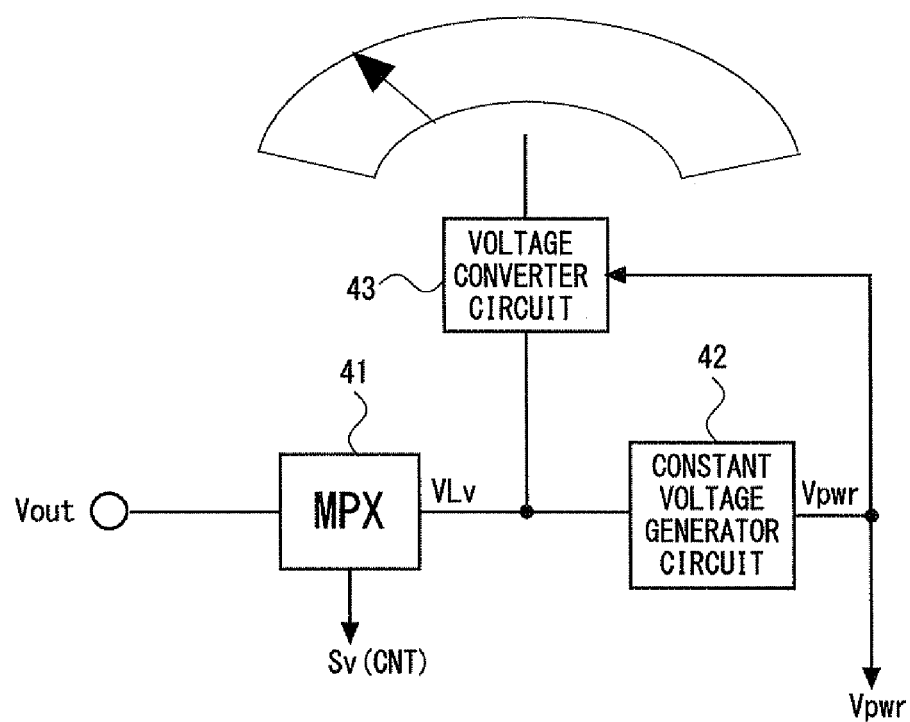
FIG. 5 is a block diagram of a reception power monitoring device according to the first exemplary embodiment.

The reception power monitoring device 2 is described hereinafter in detail. FIG. 5 shows a block diagram of the reception power monitoring device 2 according to the first exemplary embodiment. As shown in FIG. 5, the reception power monitoring device 2 includes a splitter circuit 41, a constant voltage generator circuit 42, and a voltage converter circuit 43.

The splitter circuit 41 splits the monitoring terminal signal Vout supplied from the communication device 1 into DC component and AC component, and outputs the AC component as a voice signal Sv, and outputs the DC component as a monitoring level signal VLv to the constant voltage generator circuit 42 and the voltage converter circuit 43. The voice signal Sv is processed in a voice processing circuit, which is not shown, and output as a voice to the outside.

The constant voltage generator circuit 42 outputs constant voltage from the monitoring level signal VLv. The constant voltage serves as an operating power supply voltage Vpwr of the voltage converter circuit 43. Note that the operating power supply voltage Vpwr may be supplied to another circuit such as a voice processing circuit, which is not shown.

The voltage converter circuit 43 operates based on the constant voltage (for example, the operating power supply voltage Vpwr) and outputs a display level indication signal that reflects the voltage level of the monitoring terminal signal Vout (or the monitoring level signal VLv). The reception power monitoring device 2 thereby performs display according to the power level of the received signal in the communication device 1.

As described above, in the communication device 1 according to the first exemplary embodiment, the monitoring terminal signal generator circuit 30 generates the level shift voltage Vsft generated by shifting the level of the signal intensity voltage Vin by the offset voltage Voff and then amplifies the power of the level shift voltage Vsft using the amplification unit 31 and thereby outputs the monitoring terminal signal Vout. Thus, the reception power monitoring device 2 that monitors the reception power of the communication device 1 can generate the operating power supply voltage Vpwr from the monitoring terminal signal Vout and operates based on the operating power supply voltage Vpwr.

Accordingly, with use of the communication device 1 and the reception power monitoring device 2 according to the first exemplary embodiment, it is possible to allow the reception power monitoring device 2 to operate without the need to prepare a power supply for the reception power monitoring device 2. Further, because the communication device 1 according to the first exemplary embodiment does not require a line or an outlet for supplying power from the communication device 1 to the reception power monitoring device 2, it is possible to simplify the configuration of the device.

Further, because the voice signal Sv is superimposed on the signal intensity voltage Vin in the communication device 1 according to the first exemplary embodiment, it is possible to hear the voice transmitted from another place based on the voice signal Sv in the reception power monitoring device 2. Furthermore, the case of only receiving the voice signal Sv is described in the above exemplary embodiment. However, it is feasible to mount a microphone to the reception power monitoring device 2, superimpose a voice signal generated by the microphone onto the signal intensity voltage Vin in the same manner as the voice signal Sv to be received and transmit it to the communication device 1. Then, the communication device 1 may perform transmission processing on the voice signal and thereby transmit it to a communication device installed in another place.

Second Exemplary Embodiment

Figure 6:
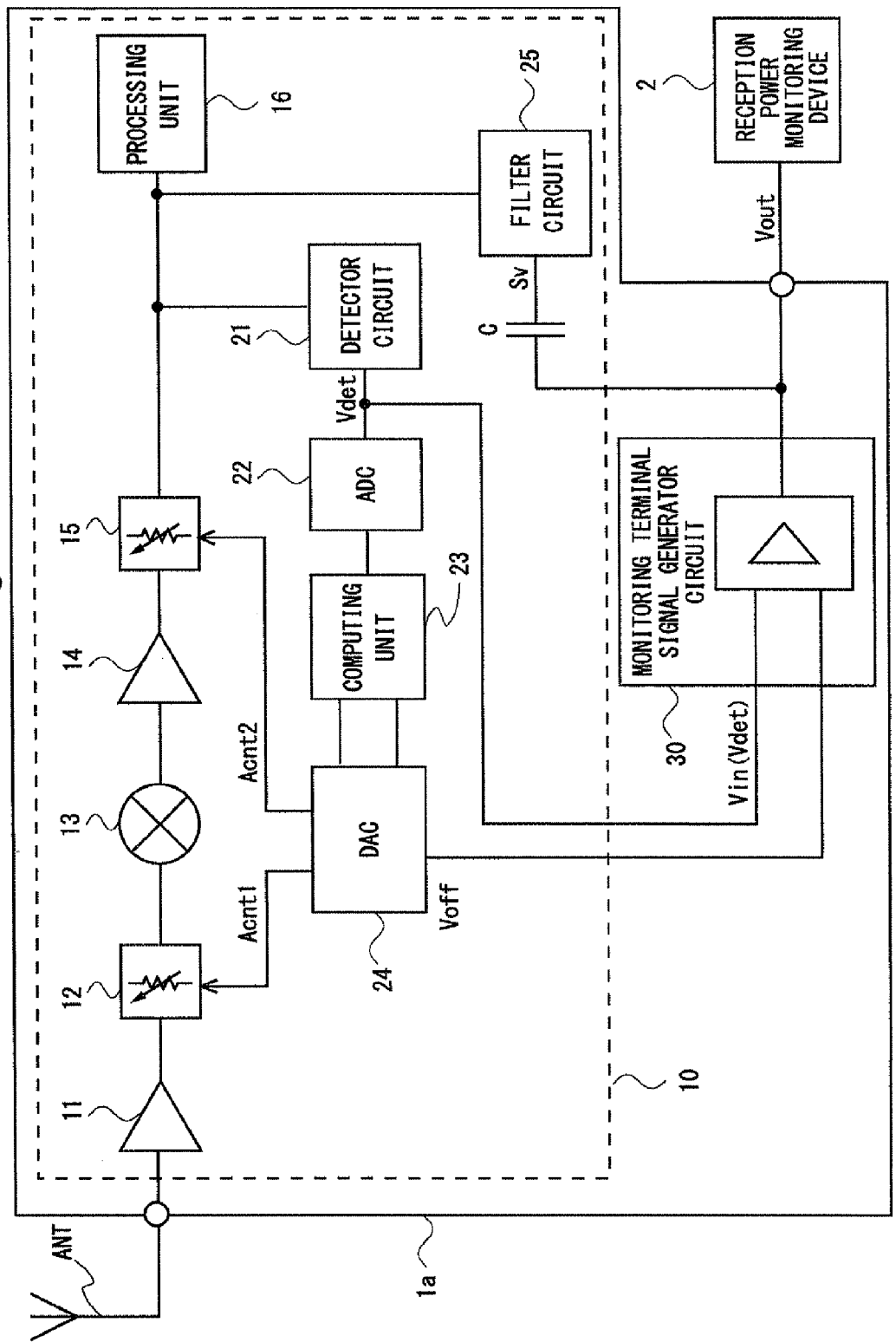
FIG. 6 is a block diagram of a communication device system according to a second exemplary embodiment.

In the second exemplary embodiment, another exemplary aspect of the communication device 1 according to the first exemplary embodiment is described. FIG. 6 shows a block diagram of a communication device 1a according to the second exemplary embodiment. Note that, in the description of the second exemplary embodiment, the same elements as those described in the first exemplary embodiment are denoted by the same reference numerals as in the first exemplary embodiment and not redundantly described.

As shown in FIG. 6, in the communication device 1a according to the second exemplary embodiment, the detection level signal Vdet output from the detector circuit 21 is used as it is as the signal intensity voltage Vin. Further, in the communication device 1a according to the second exemplary embodiment, the voice signal Sv output from the filter circuit 25 is superimposed on the monitoring terminal signal Vout output from the monitoring terminal signal generator circuit 30 because if the voice signal Sv is superimposed on the signal intensity voltage Vin, there is a possibility that the voltage level of the detection level signal Vdet is incorrectly converted in the analog-to-digital converter 22.

As described above, if the detection level signal Vdet and the signal intensity voltage Vin are the same voltage, by using the detection level signal Vdet as it is as the signal intensity voltage Vin as in the communication device 1a according to the second exemplary embodiment, it is possible to reduce an error that occurs in the conversion between an analog value and a digital value. Further, by reducing the conversion processing between an analog value and a digital value, it is possible to simplify the configuration of the digital-to-analog converter 24.

Third Exemplary Embodiment

Figure 7:
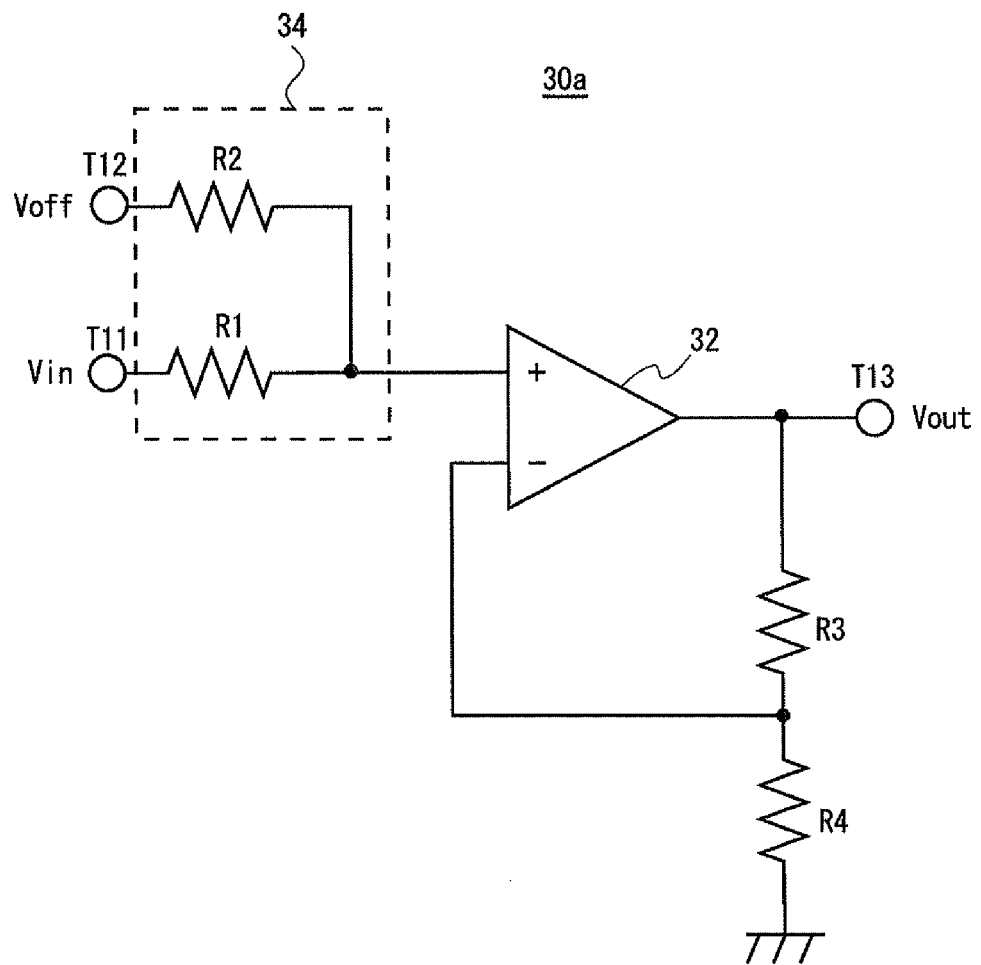
FIG. 7 is a block diagram of a monitoring terminal signal generator circuit according to a third exemplary embodiment.

In the third exemplary embodiment, a monitoring terminal signal generator circuit 30a, which is another exemplary aspect of the monitoring terminal signal generator circuit 30, is described. FIG. 7 shows a block diagram of the monitoring terminal signal generator circuit 30a according to the third exemplary embodiment. Note that, in the description of the third exemplary embodiment, the same elements as those described in the first exemplary embodiment are denoted by the same reference numerals as in the first exemplary embodiment and not redundantly described.

As shown in FIG. 7, in the monitoring terminal signal generator circuit 30a, the amplification unit 31 of the monitoring terminal signal generator circuit 30 is composed only of the operational amplifier 32. The output transistor 33 of the amplification unit 31 according to the first exemplary embodiment supplements the current output capacity of the operational amplifier 32, and therefore this configuration can be employed if the current output capacity of the operational amplifier 32 is sufficient.

As described above, by using the monitoring terminal signal generator circuit 30a, it is possible to omit the output transistor 33 and reduce the circuit size.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2013-048045, filed on Mar. 11, 2013, the disclosure of which is incorporated herein in its entirety by reference.

REFERENCE SIGNS LIST 1, 1a COMMUNICATION DEVICE
2 RECEPTION POWER MONITORING DEVICE
10 RECEPTION PROCESSING UNIT
11 AMPLIFIER
12 ATTENUATOR
13 MIXER
14 AMPLIFIER
15 ATTENUATOR
16 SIGNAL PROCESSING UNIT
21 DETECTOR CIRCUIT
22 ANALOG-TO-DIGITAL CONVERTER
23 COMPUTING UNIT
24 DIGITAL-TO-ANALOG CONVERTER
25 FILTER CIRCUIT
30, 30a MONITORING TERMINAL SIGNAL GENERATOR CIRCUIT
31 AMPLIFICATION UNIT
32 OPERATIONAL AMPLIFIER
33 OUTPUT TRANSISTOR
34 VOLTAGE ADDITION UNIT
41 SPLITTER CIRCUIT
42 CONSTANT VOLTAGE GENERATOR CIRCUIT
43 VOLTAGE CONVERTER CIRCUIT

The invention claimed is:

1. A communication device comprising:
   a reception processing unit that superimposes a voice signal generated based on a received signal on a signal intensity voltage in accordance with a signal level of the received signal and outputs the signal intensity voltage; and
   a monitoring terminal signal generator circuit that generates a monitoring terminal signal by current amplification of a level shift voltage generated by shifting a level of the signal intensity voltage by an offset voltage corresponding to a voltage value of a power supply voltage of an external device.

2. The communication device according to claim 1, wherein the monitoring terminal signal generator circuit comprises:
   a voltage addition unit that generates the level shift voltage by adding the offset voltage and the signal intensity voltage; and
   an amplification unit that amplifies the level shift voltage by current amplification.

3. The communication device according to claim 1, wherein the monitoring terminal signal is transmitted to the external device through one signal line.

4. A reception power monitoring device comprising:
   a splitter circuit that splits a monitoring terminal signal output by a communication device to be monitored in accordance with a signal level of a received signal into an AC component including a voice signal and a DC component corresponding to a DC voltage level of the monitor terminal signal;
   a constant voltage generator circuit that outputs a constant voltage from the DC component;
   a voltage converter circuit that operates based on the constant voltage and outputs a display level indication signal reflecting a voltage level of the monitoring terminal signal; and
   a voice processing circuit that outputs a voice based on the AC component.

5. The reception power monitoring device according to claim 4, further comprising:
   a display unit that displays the signal level of the received signal in accordance with the display level indication signal.

6. The reception power monitoring device according to claim 4,
   wherein the monitoring terminal signal is transmitted to the reception power monitoring device through one signal line.

7. A communication device system comprising:
   a communication device including:
      a detector circuit that outputs a signal intensity voltage in accordance with a signal level of a received signal,
      a filter circuit that superimposes a voice signal generated based on the received signal on the signal intensity voltage, and
      a monitoring terminal signal generator circuit that generates a monitoring terminal signal by current amplification of a level shift voltage generated by shifting a level of the signal intensity voltage by an offset voltage; and
   a reception power monitoring device including:
      a splitter circuit that splits the monitoring terminal signal into an AC component including a voice signal and a DC component corresponding to a DC voltage level of the monitoring terminal signal,
      a constant voltage generator circuit that outputs a constant voltage from the DC component,
      a voltage converter circuit that operates based on the constant voltage and outputs a display level indication signal reflecting a voltage level of the monitoring terminal signal, and
      a voice processing circuit that outputs a voice based on the AC component.

8. The communication device system according to claim 7, wherein the monitoring terminal signal generator circuit comprises:
   a voltage addition unit that generates the level shift voltage by adding the offset voltage and the signal intensity voltage; and
   an amplification unit that amplifies the level shift voltage by current amplification.

9. The communication device system according to claim 7, wherein the reception power monitoring device further comprises:
   a display unit that displays the signal level of the received signal in accordance with the display level indication signal.

10. The communication device system according to claim 7, wherein the monitoring terminal signal is transmitted from the communication device to the reception power monitoring device through one signal line.

* * * * *